(12) United States Patent
Cho et al.

(10) Patent No.: US 7,173,861 B2
(45) Date of Patent: Feb. 6, 2007

(54) NONVOLATILE MEMORY DEVICE FOR PREVENTING BITLINE HIGH VOLTAGE FROM DISCHARGE

(75) Inventors: Hyun-Chul Cho, Gyeonggi-do (KR); Yeong-Taek Lee, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 169 days.

(21) Appl. No.: 10/977,703

(22) Filed: Oct. 28, 2004

(65) Prior Publication Data

US 2005/0117378 A1 Jun. 2, 2005

(30) Foreign Application Priority Data

Dec. 1, 2003 (KR) .................. 10-2003-0086373

(51) Int. Cl.
*G11C 16/04* (2006.01)
(52) U.S. Cl. .................. 365/185.29; 365/185.18; 365/189.05; 365/226
(58) Field of Classification Search ..... 365/185.11–18, 365/185.29, 189.05, 226
See application file for complete search history.

(56) References Cited

U.S. PATENT DOCUMENTS

| 5,627,779 | A | * | 5/1997 | Odake et al. ........... 365/185.01 |
| 5,661,690 | A | * | 8/1997 | Roohparvar ................. 365/201 |
| 6,052,321 | A | * | 4/2000 | Roohparvar ................. 365/201 |
| 6,509,787 | B1 | * | 1/2003 | Kang ........................... 327/541 |

* cited by examiner

*Primary Examiner*—Tuan T. Nguyen
(74) *Attorney, Agent, or Firm*—Marger Johnson & McCollom, P.C.

(57) ABSTRACT

According to some embodiments, a nonvolatile semiconductor memory device includes high voltage circuits that prevent high voltages, which are applied to bitlines during an erase operation, from being applied to low voltage circuits that are operable with low voltages. Each high voltage circuit includes a first switching circuit for selectively isolating the low voltage circuit from the bitlines, and a second switching circuit for inhibiting a leakage current to the low voltage circuit from the bitlines. The second switching circuit is connected between the first switching circuit and the low voltage circuit.

34 Claims, 7 Drawing Sheets

NONVOLATILE MEMORY DEVICE FOR PREVENTING BITLINE HIGH VOLTAGE FROM DISCHARGE

CROSS-REFERENCE TO RELATED APPLICATIONS

This patent application claims priority from Korean Patent Application 2003-86373, filed on 1 Dec. 2003, the content of which is hereby incorporated by reference in its entirety for all purposes.

BACKGROUND OF THE INVENTION

1. Field of the Invention

This disclosure relates to a nonvolatile memory device, and more particularly, to a nonvolatile memory device that prevents a high voltage of a bitline from being discharged.

2. Description of the Related Art

Electrically-Erasable Programmable Read-Only Memories (EEPROMs) and flash EEPROMs, or flash memories, are convenient in that data can be electrically reprogrammable after erasing previous data is erased. Thus, they are widely used today. NAND flash memories are especially advantageous to achieving high integration densities relative to other commercial flash memories.

In general, a NAND flash memory has a cell array that includes a number of cell strings, each cell string constructed of memory cells connected in series. A single memory cell is formed of a control gate, a floating gate, and a source and drain in a bulk. The F-N (Fowler-Nordheim) tunneling effect is used to erase data by block (or sector) and to program data by page.

For example, when a NAND flash memory is programmed, a low voltage (e.g. 0V) is applied to the source and drain while a high voltage (e.g. over 15V) is applied to the control gate, so that electrons are injected into the floating gate from the bulk to raise a threshold voltage thereof. It is referred to as being written with data "0" (i.e., a programmed cell). When the flash memory is erased, a negative voltage is applied to the control gate while a high voltage is applied to the bulk, so that electrons move into the bulk from the floating gate to lower a threshold voltage thereof. It is referred to as being erased and as storing data "1" (i.e., an erased cell).

FIG. 1 is a cross-sectional diagram illustrating a cell string of a conventional NAND flash memory device. In the structure, a pocket P-well 3 is surrounded by an N-well 2 in a semiconductor substrate 1. Within the pocket P-well 3, which is formed at a predetermined depth in the N-well 2, N+ active regions are spaced apart from each other by channel regions therebetween.

When an erase voltage VER of high voltage level is applied to the bulk (the pocket P-well 3 and the N+ well 2), the erase voltage VER is coupled to a bitline BL through the forward bias of PN junctions between the pocket P-well 3 and the N+ active regions. As the erase voltage VER is about 20V, the transistors connected to the bitline BL must be able to endure this high voltage. Also, the erase voltage VER must be carefully managed to prevent it from being applied directly to low voltage circuits used in page buffers or bitline drivers.

FIG. 2 is a circuit diagram illustrating cell strings in a conventional NAND flash memory circuit that have a shielded bit line architecture as disclosed by U.S. Pat. No. 6,480,419 entitled "Bit line setup and discharge circuit for programming non-volatile memory."

The circuit illustrated in FIG. 2 includes a cell array 10, a first high voltage circuit 20, a second high voltage circuit 30, a page buffer 40, and a bitline driver 50. The page buffer 40 and bitline driver 50 are operable with a power supply voltage Vcc.

The cell array 10 is composed of a number of cell strings connected to respective bitlines BLe0, BLo0, BLe1, and BLo1. While FIG. 2 illustrates four cell strings for convenience, it should be understood that there may be many more cell strings within the cell array 10 in accordance with practical dimensions of the flash memory device. Each cell string includes a string selection transistor, a ground selection transistor, and memory cells connected in series between the selection transistors. The string selection transistor, the memory cells, and the ground selection transistor are coupled to a string selection line SSL, wordlines WL0~WLn-1, and a ground selection line GSL, respectively. The lines SSL, WL0~WLn-1, and DSL carry outputs from a row decoder (not shown). The bitlines are connected to the page buffer 40 and the bitline driver 50.

In memory cell array structures that do not have the high voltage circuits 20 and 30, malfunctions may easily occur between adjacent bitlines because of increasing coupling capacitances between the bitlines as integration densities of the NAND flash memories become higher. In particular, a bitline biased to 0V may drop to a voltage of its adjacent bitline biased on the power supply voltage Vcc. This may cause a programming operation instability, which forces a memory cell that should be in an erase state to be programmed.

For the purpose of overcoming the above problem, shielded bitline architectures for flash memory devices have been proposed. In the shielded bitline architecture of FIG. 2, switching transistors NM0~NM3 and NM4~NM7 of the high voltage circuits 20 and 30 select an alternative one among the even-ordered bitlines BLe0 and BLe1 or among the odd-ordered bitlines BLo0 and BLo1, during a read operation or a programming operation. While selected bitlines are conductive during a read operation or during a programming operation, deselected bitlines act as shielding means for the selected bit lines to reduce the coupling effects between the selected bitlines.

However, even with the shielded bitline architecture, a high voltage applied to the bitlines may still be discharged toward the page buffer 40 or the bitline driver 50. This will become more apparent with reference to FIGS. 3 and 4 that are explained in further detail below.

Returning to FIG. 2, the first high voltage circuit 20 includes the high voltage transistors NM0~NM3. During an erase operation, gates of the high voltage transistors are coupled to 0V, which prevents the high bitline voltage from being applied to nodes SO0 and SO1 that are positioned in a low voltage field. However, undesirable leakage currents may still be generated in the layout structure with narrower bitline pitches that cause a high voltage to be forwarded into the low voltage field.

FIG. 3 is a diagram illustrating a layout pattern of the first high voltage circuit 20 of FIG. 2. Referring to FIG. 3, the first high voltage circuit 20 may be compartmented into a high voltage field and a low voltage field, in accordance with the dispositions of the high voltage transistors NM0~NM3. During an erase operation, a voltage of 0V is applied to gates of the high voltage transistors NM0~NM3. The portion of the bitlines BLe0, BLo0, BLe1, and BLo1 connected to the drains D0~D3 of the transistors M0~M3 belong to the high voltage field, while the portion of the bitlines connected to the nodes SO0 and SO1 belong to the low voltage field.

During an erase operation, the bitline BLe0 connected to a drain D0 of the high voltage transistor NM0 is operable in the low voltage field, while the bitline BLo0 connected to a drain D1 of the high voltage transistor NM1 is operable in the high voltage field. If a distance between a DC (Direct Contact) contact in the high voltage field and a bitline in the low voltage field is narrow, it may occur with an undesirable effect such as an oxide breakdown or a high voltage leakage between the high and low voltage fields when there have been misalignments or micro-bridges during a manufacturing process. The defective results arise from the fact that an electric field is enlarged in accordance with a narrower distance between the high and low voltage fields.

Further, while the node SO0 is being floated because the gate voltage of the high voltage transistor is 0V, a PMOS transistor PM0 of the page buffer 40 generates a leakage current without coupling by the high voltage because self-capacitance of the bitline is very larger than the coupling capacitance therebetween. Thus, the high voltage consumed by the leak current caused from a forward bias of a PN junction between the drain (P+) of the PMOS transistor and the bulk of N-well is discharged into the bulk region. This mechanism may cause undesirable reduction of the high voltage during an erase operation. Such a decrease of the high voltage applied to the bulk of the memory cells during an erase operation acts as a leading factor declining product yields and reliabilities.

In FIG. 2, the second high voltage circuit 30 includes the high voltage transistors NM4~NM7. During an erase operation, 0V is applied to the gates of the high voltage transistors NM4~NM7 in order to prevent the high bitline voltage from being forwarded into the low-voltage field. However, if the pitch (or distance) between the bitlines isolated from each other on the layout arrangement are narrow, undesirable leakage currents may occur resulting in a high voltage surge into the low-voltage field.

FIG. 4 is a diagram illustrating a layout pattern of the second high voltage circuit 30 of FIG. 2. Referring to FIG. 4, the high voltage circuit 30 is divided into a high voltage field and a low-voltage field. During an erase operation, 0V is applied to gates of the high voltage transistors. Here, the portion of the bitlines BLe0, BLo0, BLe1, and BLo1 connected between drains D4~D7 of the transistors NM4~NM7 and the memory cell array 10 are disposed in the high voltage field. The portion of the bitlines BLe0, BLo0, BLe1, and BLo1 connected between the virtual power node VIRPWR and the sources S4~S7 of the transistors NM4~NM7 are disposed in the low voltage field.

Because short distances exist between DC contacts of the high voltage field and bitlines of the low voltage field, an oxide breakdown or a high voltage discharge may occur between the high and low voltage fields during an erase operation if there are any misalignments or micro-bridges present from the manufacturing process. Such phenomena are induced by an electric field extending along the narrower spaces between the high and low voltage fields.

Furthermore, while the virtual power node VIRPWR is floated when the gate voltages of the high voltage transistors are at 0V, a high voltage may still be discharged through the PMOS transistor 51 without coupling thereto because the coupling capacitance is much larger than the self-capacitance of the bitline. In other words, the high voltage is discharged by way of a forward-biased PN junction between the N-well bulk and the P+ drain of the PMOS transistor 51 that is located in the bulk. This drop of high voltage during an erase operation is a significant factor contributing to the degradation in operational reliability of the flash memory device.

Embodiments of the invention address these and other disadvantages of the conventional art.

SUMMARY OF THE INVENTION

According to embodiments of the invention, a nonvolatile semiconductor memory device prevents a bitline high voltage from being drained (or discharged) into a lower voltage circuit during an erase operation of the memory device.

BRIEF DESCRIPTION OF THE DRAWINGS

The accompanying drawings are included to provide a further understanding of the invention, and are incorporated in and constitute a part of this specification. The drawings illustrate example embodiments of the invention and, together with the description, serve to explain principles of the invention.

DETAILED DESCRIPTION OF THE INVENTION

Preferred embodiments of the invention will now be described below in more detail with reference to the accompanying drawings. The invention may, however, be embodied in different forms and should not be constructed as limited to the embodiments set forth herein. Rather, these embodiments are provided so that this disclosure will be thorough and complete, and will fully convey the scope of the invention to those skilled in the art. Like numerals refer to like elements throughout the specification.

Some embodiments of the invention are applicable to NAND flash memory devices having a memory cell array constructed of a number of cell strings, each cell string including a number of memory cells connected in series between a string selection transistor and a ground selection transistor. Some embodiments of the invention are applicable to NAND flash memory devices that use high voltages for an erase operation. According to some embodiments of the invention, an erase operation in a NAND flash memory device may be performed in one or more sectors (blocks) of the entire memory cell array. As used in the following description, the term "high voltage" indicates a voltage higher than a power supply voltage of the NAND flash memory device.

Figure 1:
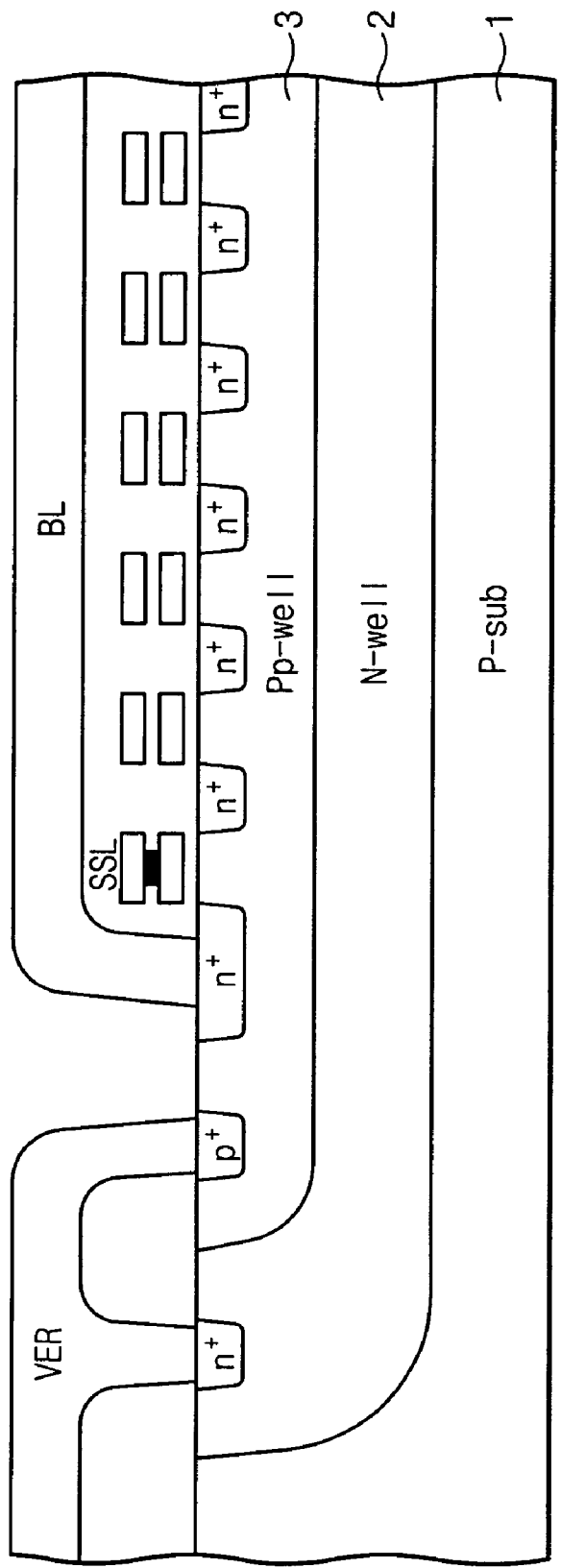
FIG. 1 is a cross-sectional diagram illustrating a cell string of a conventional nonvolatile memory device.
Figure 2:
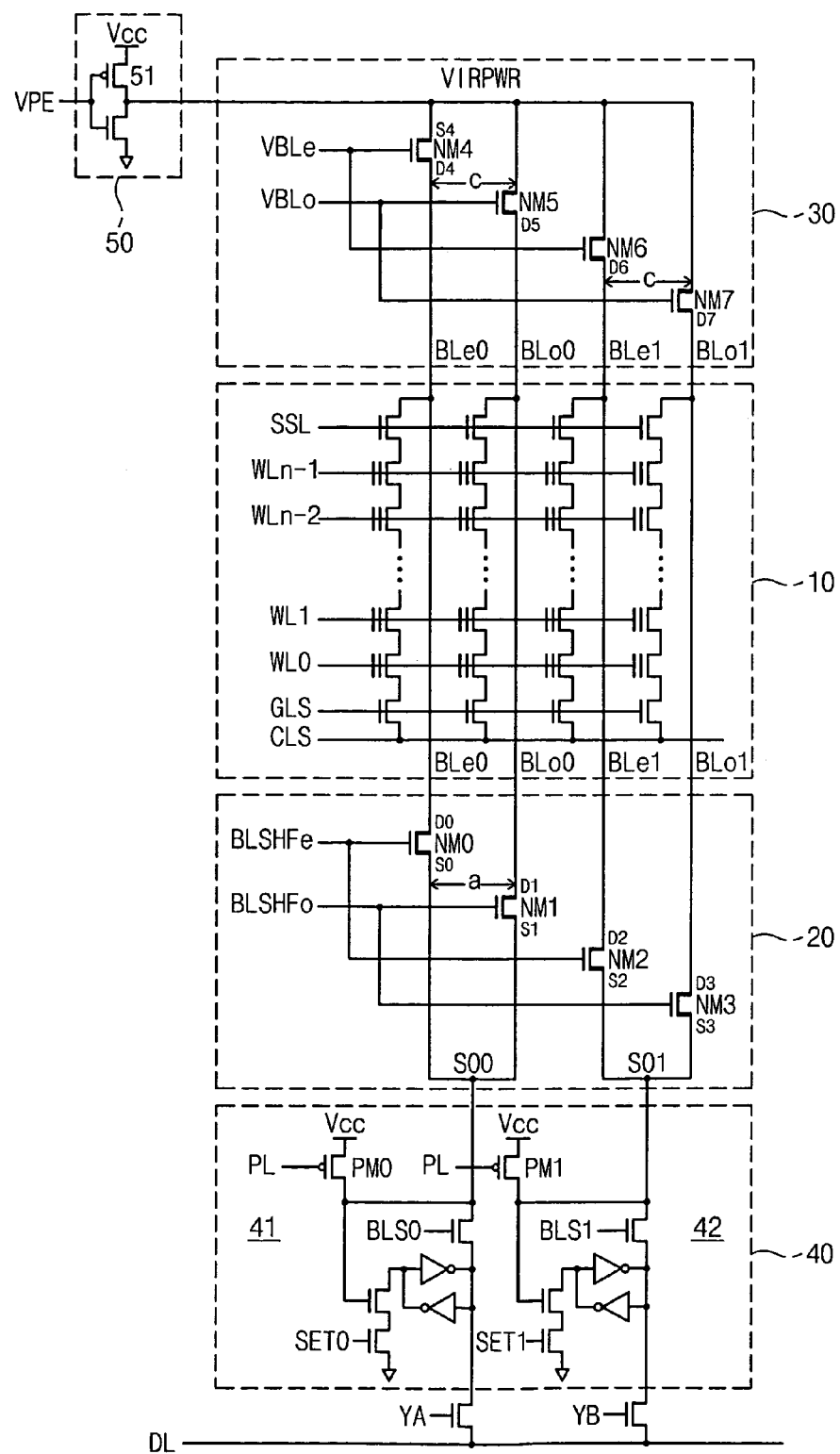
FIG. 2 is a circuit diagram illustrating cell strings in a conventional NAND flash memory circuit that have a shielded bit line architecture.
Figure 3:
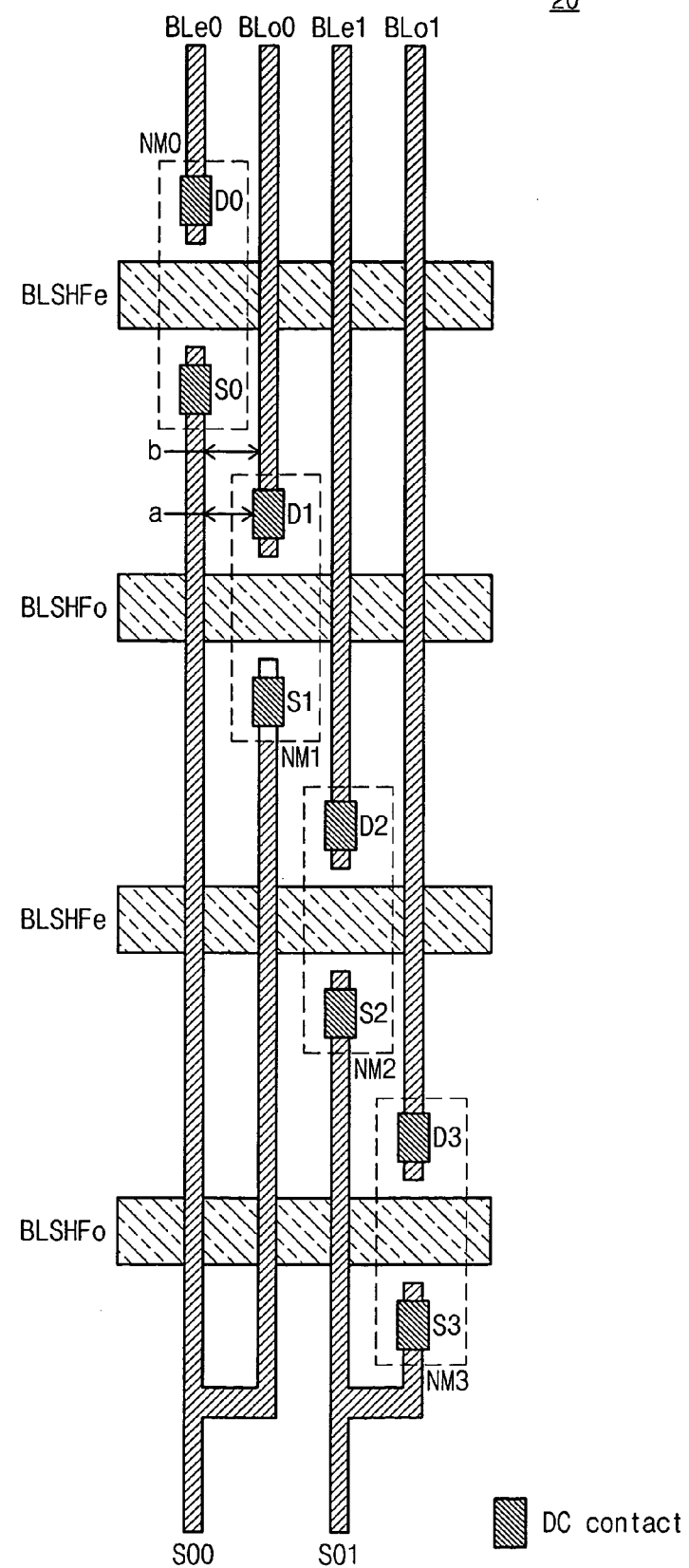
FIG. 3 is a diagram illustrating a layout pattern for the first high voltage circuit of FIG. 2.
Figure 4:
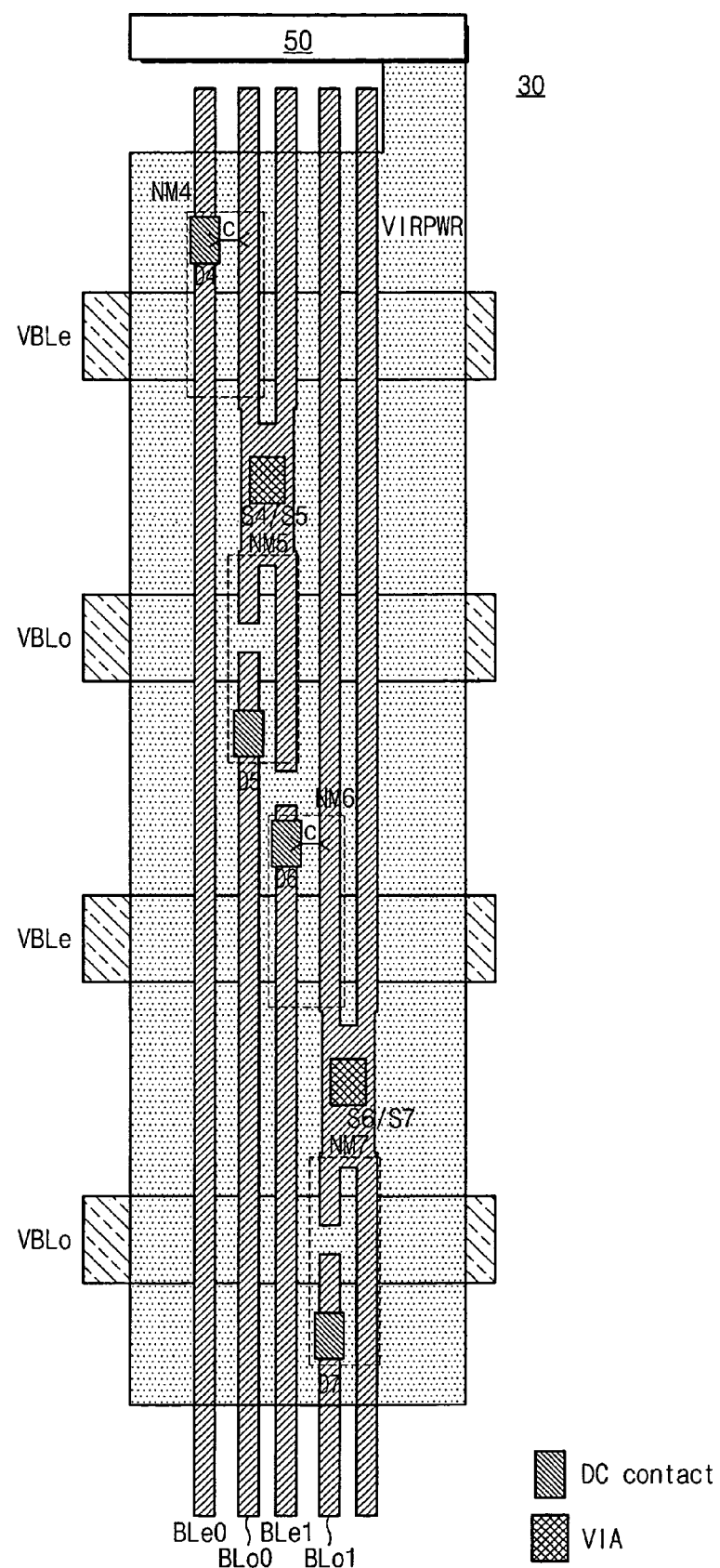
FIG. 4 is a diagram illustrating a layout pattern for the second high voltage circuit of FIG. 2.
Figure 5:
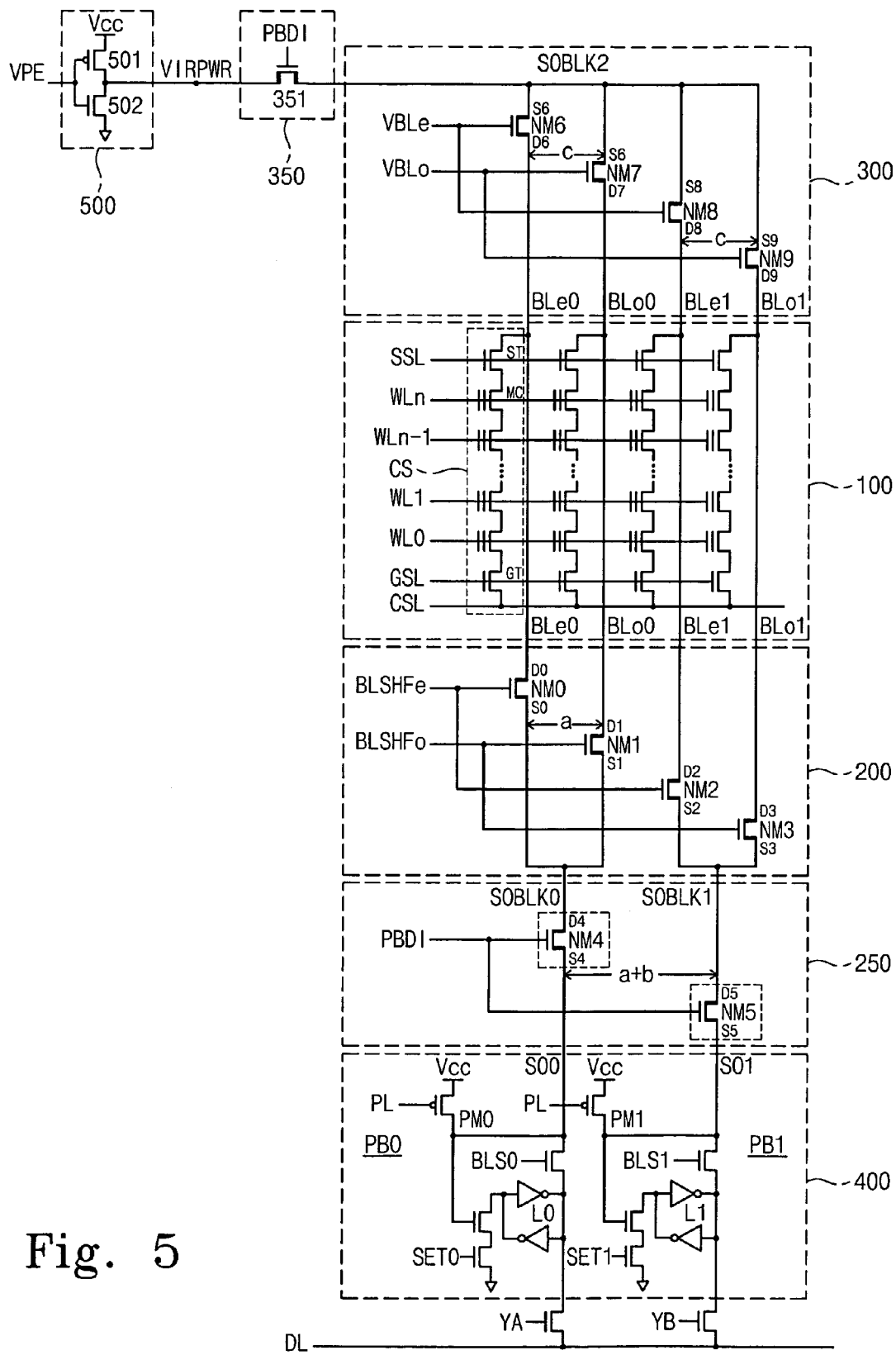
FIG. 5 is a circuit diagram illustrating a nonvolatile memory device according to some embodiments of the invention.

FIG. 5 is a circuit diagram illustrating a memory cell array and some peripheral circuits of a NAND flash memory device according to some embodiments of the invention.

Referring FIG. 5, the NAND flash memory device includes a memory cell array 100, a first high voltage switching circuit 200, a second high voltage switching circuit 250, a third high voltage switching circuit 300, a fourth high voltage switching circuit 350, a page buffer circuit 400, and a bitline driver 500.

The memory cell array 100 includes a number of cell strings CS arranged in a matrix, each cell string coupled to a string selection line SSL, a number of wordlines WL0~WLn-1, a ground selection line GSL, a common source line CSL, and a number of bitlines BLe0, BLo0, BLe1, and BLo1. The bitlines may be classified into the even-ordered bitlines BLe0 and BLe1 and the odd-ordered bitlines BLo0 and BLo1. Each cell string CS includes a string selection transistor ST whose gate is coupled to the string selection line SSL, a number of floating gate memory cell transistors MC whose gates are coupled to a corresponding one of the wordlines WL0~WLn-1, and a ground selection transistor GT whose gate is coupled to the ground selection line GSL. The string selection transistor ST, the memory cell transistors MC, and the ground selection transistor GT are connected in series between the corresponding bitline (e.g., BLe0) and the common source line CSL.

During an erase operation, the bitlines BLe0~BLo1 are selectively coupled to a high voltage (e.g., 20V) that is greater than a power supply voltage Vcc. As aforementioned, the high voltage on the bitlines is induced from a forward bias of the PN junction by an erase voltage applied to the bulk.

The first and second high voltage switching circuits 200, 250 are connected between the memory cell array 100 and the page buffer 400 to prevent the high bitline voltage from being discharged into the page buffer 400.

The first high voltage switching circuit 200 includes a number of high voltage NMOS transistors NM0~NM3, the number of transistors corresponding to the number of the bitlines. The second high voltage switching circuit 250 includes high voltage NMOS transistors NM4 and NM5, which are respectively connected to pairs of the high voltage switching transistors NM0, NM1 and NM2, NM3 of the first high voltage switching circuit 200. The high voltage NMOS transistors NM0~NM9 are designed to withstand (or be operable with) a high voltage that is greater than a power supply voltage Vcc and that is applied to the bitline.

In the first high voltage switching circuit 200, the transistor NM0 is connected between the bitline BLe0 and the transistor NM4 of the second high voltage switching circuit 250 and has a gate coupled to even-bitline shielding signal BLSHFe. The transistor NM1 is connected between the bitline BLo0 and the transistor NM4 of the second high voltage switching circuit 250 and has a gate coupled to odd-bitline shielding signal BLSHFo. The transistor NM2 is connected between the bitline BLe1 and the transistor NM5 of the second high voltage switching circuit 250 and has a gate coupled to the even-bitline shielding signal BLSHFe. The transistor NM3 is connected between the bitline BLo1 and the transistor NM5 of the second high voltage switching circuit 250 and has a gate coupled to the odd-bitline shielding signal BLSHFo. During an erase operation, the bitline shielding signals BLSHFe and BLSHFo are applied with voltage levels higher than the power supply voltage Vcc.

In the second high voltage switching circuit 250, the transistor NM4 is connected between the page buffer 400 and a common high voltage node SOBLK0 for the transistors NM0 and NM1 of the first high voltage switching circuit 200, while the transistor NM5 is connected between the page buffer 400 and a common high voltage node SOBLK1 for the transistors NM2 and NM3 of the first high voltage switching circuit 200. Gates of the high voltage switching transistors NM4 and NM5 are coupled to an isolation signal PBDI. The isolation signal PBDI is applied with a voltage level equal to or lower than the power supply voltage Vcc.

The high voltage node SOBLK0 is interposed between the high voltage transistors NM0 and NM1 of the first high voltage switching circuit 200 and the high voltage transistor NM4 of the second high voltage switching circuit 250. The high voltage node SOBLK1 is interposed between the high voltage transistors NM2 and NM3 of the first high voltage switching circuit 200 and the high voltage transistor NM5 of the second high voltage switching circuit 250.

The page buffer circuit 400 is connected between the second high voltage switching circuit 250 and a data line DL. The page buffer circuit 400 includes page buffers PB0 and PB1, each of which corresponds to a pair of the even- and odd-ordered bitlines (e.g., BLe0 and BLo0, or BLe1 and BLo1). The page buffers PB0 and PB1 are selectively connected to the bitlines during a program operation or a read operation. The page buffer PB0 is connected to the bitlines BLe0 and BLo0 by way of the high voltage transistor NM4 of the second high voltage switching circuit 250, and by way of the parallel-coupled high voltage transistors NM0 and NM1 of the first high voltage switching circuit 200. The page buffer PB1 is connected to the bitlines BLe1 and BLo1 by way of the high voltage transistor NM5 of the second high voltage switching circuit 250, and by way of the parallel-coupled high voltage transistors NM2 and NM3 of the first high voltage switching circuit 200. Each page buffer PB0, PB1 includes a latch (L0 or L1) to store data to be programmed or data that is read out from a selected memory cell on its corresponding bitline, a PMOS transistor (PM0 or PM1) to load the power supply voltage Vcc as a precharge level in response to a loading signal PL, and NMOS transistors to select a corresponding bitline and to operate data sensing therein. As the page buffer 400 is designed to be operable within the range of the power supply voltage Vcc or lower than Vcc, sensing nodes respective to the page buffers PB0 and PB1 in the page buffer circuit 400, SO0 and SO1, should be conductive at or below the level of the power supply voltage Vcc.

When a voltage higher than the power supply voltage Vcc is supplied to the bitlines during an erase operation, the page buffer circuit 400 is electrically and selectively isolated from the bitlines.

The third and fourth high voltage switching circuits 300 and 350 are connected between the bitline driver 500 and the bitlines of the memory cell array 100, preventing high voltage leakage (or discharge) from the bitlines to the bitline driver 500 during an erase operation. Like the first and second high voltage switching circuits 200 and 250, the third and fourth high voltage switching circuits 300 and 350 include high voltage transistors.

The third high voltage switching circuit 300 electrically isolates the bitline driver 500 from the bitlines when a voltage higher than the power supply voltage Vcc is applied to the bitlines during an erase operation. The bitline driver 500 is operative with a voltage equal to or less than the power supply voltage Vcc. The third high voltage switching circuit 300 is connected between the memory cell array 100 and the fourth high voltage switching circuit 350. The third high voltage switching circuit 300 includes the high voltage NMOS transistors NM6~NM9, each of which are connected to a corresponding bitline BLe0, BLo0, BLe1, and BLo1. Gates of the high voltage transistors NM6 and NM8 are coupled to an even-bitline voltage signal VBLe, while gates of the high voltage transistors NM7 and NM9 are coupled to an odd-bitline voltage signal VBLo. During an erase operation, the bitline voltage signals VBLe and VBLo are applied with a voltage greater than the power supply voltage Vcc, i.e., a high voltage.

The fourth high voltage switching circuit 350 includes a high voltage NMOS transistor 351 connected between the bitline driver 500 and the third high voltage switching circuit 300. The high voltage NMOS transistor 351 is connected to the high voltage transistors NM6~NM9 of the third high voltage switching circuit 300 through a high voltage node SOBLK2, while its other side is connected to an output of the bitline driver 500 through a virtual power node VIRPWR. A gate of the high voltage transistor 351 is coupled to the isolation signal PBDI that is conductive within the range of the power supply voltage Vcc. The high voltage transistor 351 of the fourth high voltage switching circuit 350 electrically isolates the bitline driver 500 from the third high voltage switching circuit 300 in order to prevent a leakage current from flowing into the bitline driver 500 from the bitlines.

The high voltage node SOBLK2 is interposed between the high voltage transistors NM6~NM9 of the third high voltage switching circuit 300, drains of which are coupled each other in common, and the high voltage transistor 351 of the fourth high voltage switching circuit 350.

The high voltage NMOS transistors employed in the first through fourth high voltage switching circuits, namely, NM1~NM9 and 351, are designed to be operatively endurable against a voltage that is higher than the power supply voltage Vcc, and each transistor includes a gate, a drain (D), and a source (S). Assuming that a gate-to-source voltage is VGS, a source voltage is VGS–Vth, where Vth is a threshold voltage of the high voltage NMOS transistor. When VGS>Vth, the high voltage NMOS transistor is turned on. When the source voltage is greater than VGS–Vth, the high voltage NMOS transistor is turned off. Such an operational feature of the high voltage NMOS transistor is referred to as a shut-off characteristic. If a high voltage VER is applied to the gate of the high voltage NMOS transistor, the source of the high voltage NMOS transistor is charged to a voltage level of VER–Vth by the shut-off characteristic. Therefore, when the high voltage VER is applied to the gates of the high voltage NMOS transistors, the high voltage nodes SOBLK0~SOBLK2 is set on VER–Vth.

On the other hand, when the power supply voltage Vcc, regarded as a low voltage relative to the high voltage VER, is applied to the gate of the high voltage NMOS transistor (e.g., NM4 or NM5) during an erase operation, the sensing nodes SO0~SO1 of the page buffers PB0, PB1 is set on Vcc–Vth. During an erase operation, when the low voltage (e.g., Vcc) is applied to the gate of the high voltage transistor 351 of the fourth high voltage switching circuit 350, the bitline drive node VIRPWR becomes Vcc–Vth.

The bitline driver 500 is selectively connected to the bitlines BLe0~BLo1 by way of the fourth and third high voltage switching circuits 350 and 300 during a program or read operation. The bitline driver 500 includes an inverter formed from an NMOS transistor 502 and a PMOS transistor 501 with a source connected to the power supply voltage Vcc. The gates of the transistors 501 and 502 are coupled to a voltage signal VPE. The output of the bitline driver 500 is coupled to the virtual power node VIRPWR. In practice, the bitline driver 500 may be constructed of more inverters. The bitline driver 500 precharges the bitlines when a program operation begins, and discharges the bitlines when the program operation is terminated. As the bitline driver 500 is operable at a voltage that is lower than the power supply voltage Vcc, the bitline drive node VIRPWR is always conductive under the power supply voltage Vcc.

Figure 6:
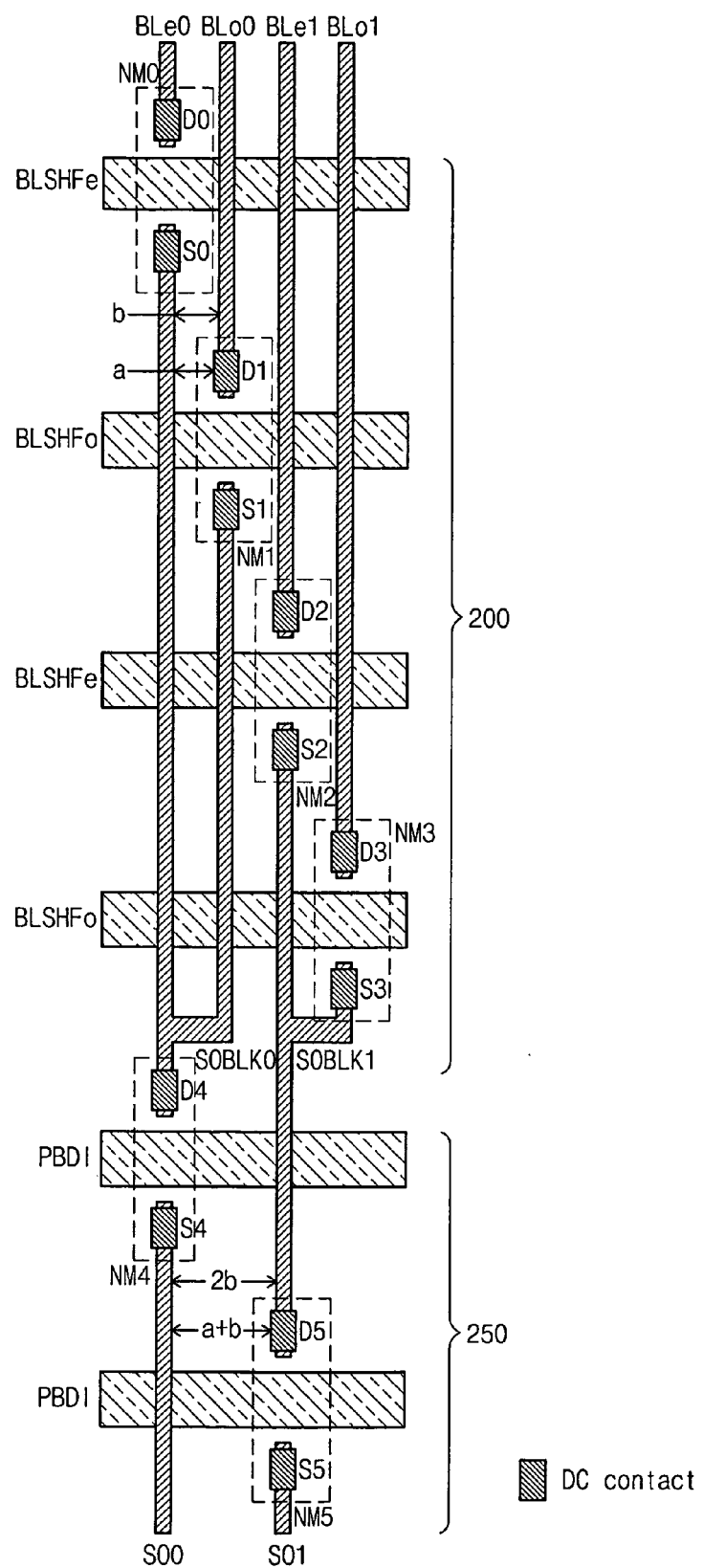
FIG. 6 is a diagram illustrating an example layout pattern for the first and second high voltage circuits of FIG. 5.

FIG. 6 is a diagram illustrating an example layout pattern for the first and second high voltage circuits 200 and 250 of FIG. 5.

As illustrated in FIG. 6, the high voltage switching circuits 200 and 250 are configured in a split bitline structure. The bitlines BLe0~BLo1 are arranged in parallel along a row direction, and extend along a column direction. The high voltage transistors NM0~NM5 of the first and second high voltage switching circuit 200 and 250 are arranged with crossing each other along the direction to which the bitlines extend, minimizing intervals (or pitches) between the bitlines. In other words, the bitlines are maximized to be adjacent from each other, in the scope of assuring a normal operation without physical and electrical troubles, and the regions of the high voltage transistors are disposed in different rows with some overlaps therebetween without being disposed in parallel simply on the same row or column. Conductive lines for transferring the bitline shielding signals BLSHFe and BLSHFo, and the isolation signal PBDI extend with intersecting the bitlines along the row direction.

As illustrated in FIG. 6, in the field of the first high voltage switching circuit 200, a bitline pitch between adjacent bitlines (e.g., BLe0 and BLo0) is referred to as (b), while (a) denotes an interval between the bitline (e.g., BLe0) and a DC contact that connects the bitline (e.g., BLo0) to the drain (e.g., D1) of the high voltage transistor (e.g., NM1). The interval (a) is narrower than the interval (b) because of the breadth of the DC contact.

In the field of the second high voltage switching circuit 250, because the number of high voltage transistors is half that of the first high voltage switching circuit 200, (a+b) is an interval between the bitline (e.g., BLe0 extending toward the sensing node SO0 that is connected to the source of the high voltage transistor NM4) and a DC contact that connects the bitline (e.g., BLe1 connected to the high voltage node SOBLK1) to the drain D5 of the high voltage transistor NM5. An interval (2b) exists between the adjacent bitlines in the second high voltage switching circuit 250.

When the high voltage VER, i.e., an erase voltage, is applied to the gates of the high voltage transistors NM0~NM3 by way of the bitline shielding signals BLSHFe and BLSHFo, the bitlines connected to the sources S0~S3 of the high voltage transistors NM0~NM3 (or the high voltage nodes SOBLK0 and SOBLK1) are charged up to VER–Vth as a high voltage level, by the shut-off characteristics of the high voltage transistors, while the DC contacts connected to their drains D0~D3 are charged to VER. Although the least interval is regarded as narrow over the circuit layout plan, there are few electric fields between the bitlines and the DC contacts because the voltage levels adjacent to each other are nearly similar. Thus, leakage of the high voltage supplied to the bitlines for erasing data stored in the memory cells may be prevented. Even if leakage occurs, it is negligible and does not affect retention of an effective bitline voltage.

Meantime, on the layout region of the second high voltage switching circuit 250, a conductive line connected between the sensing node SO0 and the source S4 of the high voltage transistor NM4 belongs to a low-voltage conductive region that is operable in Vcc or a voltage lower than Vcc, while a conductive line leading to the high voltage node SOBLK1 from the drain D5 of the high voltage transistor NM5 belongs to a high-voltage conductive field. Since the interval (a+b) between the conductive line and the DC contact in the second high voltage switching circuit 250 is wider than the interval (a) of the first high voltage switching circuit field by the bitline pitch (b), it is more effective in reducing the high voltage leakage or an oxide breakdown between the transistor gate and the bulk.

During an erase operation, when the high voltage (e.g., VER) is applied to the gates of the high voltage transistors NM0~NM3 of the first high voltage switching circuit 200 while a low voltage (e.g., Vcc) is applied to the gates of the high voltage transistors NM4 and NM5 of the second high voltage switching circuit 250, voltage levels of the sensing nodes SO0 and SO1 are established at Vcc−Vth while the nodes SOBLK0 and SOBLK1 are set on VER−Vth. Therefore, transistors in the page buffer 400 are not destroyed and product yield and reliability are improved due to the reduced degradation of the erase voltage.

Figure 7:
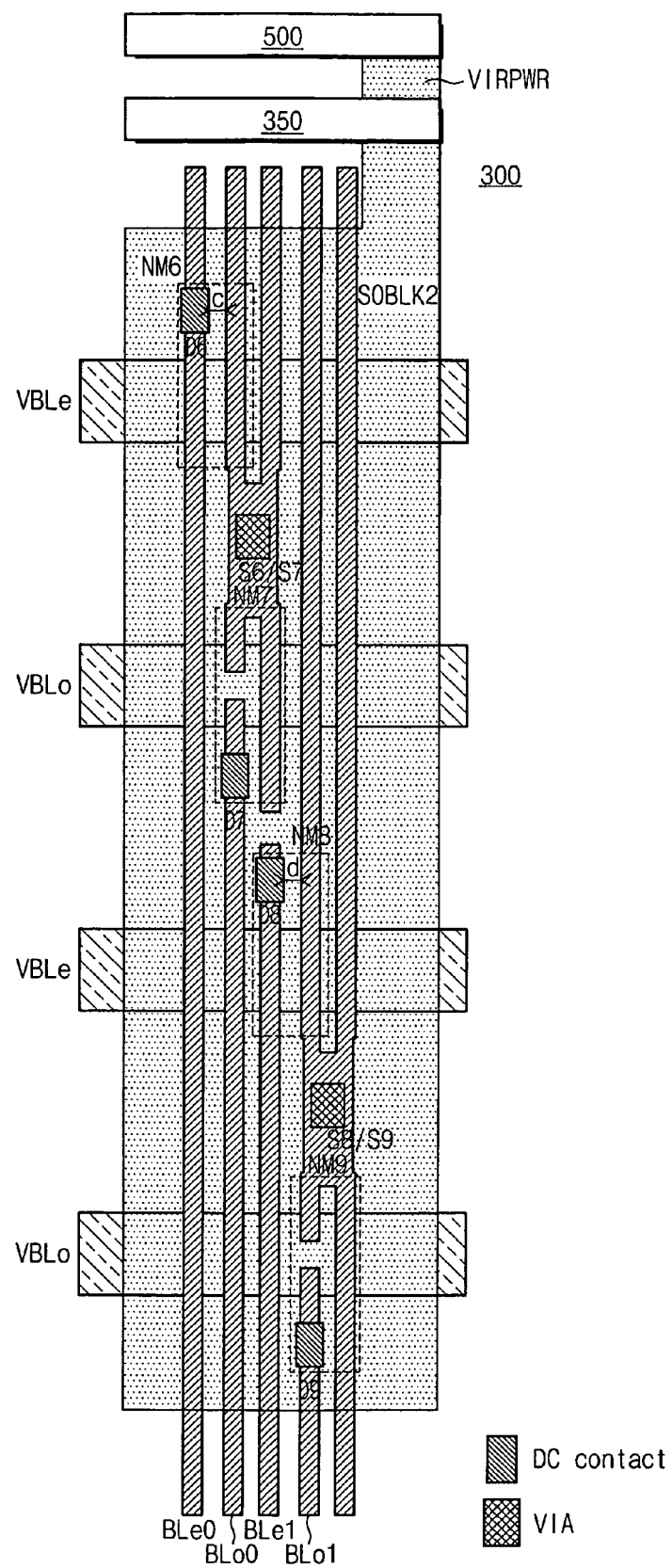
FIG. 7 is a diagram illustrating an example layout pattern for the third high voltage circuit of FIG. 5.

FIG. 7 is a diagram illustrating an example layout pattern for the third high voltage circuit 300 of FIG. 5

The layout pattern shown in FIG. 7 is similar to the layout pattern of FIG. 6, one difference being that their relative position with respect to the memory cell array 100 is opposite, the memory cell array being disposed between them. The bitlines BLe0, BLo0, BLe1, and BLo1 shown in FIG. 7, configured in the split bitline structure, may extend over the memory cell array 100 and the layout plan shown in FIG. 6.

As illustrated in FIG. 7, the virtual power node VIRPWR is disposed over the layout plan formed from the bitline driver 500 until the third high voltage switching circuit 300, where it is vertically interposed between the layer of the bitlines and the layer of the bitline voltage lines VBLe and VBLo. Like the displacement features shown in FIG. 6, the high voltage transistors NM6~NM9 of the third high voltage switching circuit 300 are arranged with crossing each other along the direction to which the bitlines extend, minimizing the intervals (or pitches) between the bitlines. In other words, the bitlines are maximized to be adjacent from each other in the scope of assuring a normal operation without physical and electrical troubles, and the regions of the high voltage transistors are disposed in different rows with some overlaps therebetween, without being disposed in parallel simply on the same row or column.

On the region of the third high voltage switching circuit 300, the layer of the virtual power node VIRPWR is connected to the high voltage node SOBLK2 through the fourth high voltage switching circuit 350. As shown in FIG. 5, in some embodiments the fourth high voltage switching circuit may be the high voltage NMOS transistor 351. Drains D6~D9 of the high voltage NMOS transistors NM6~NM9 are connected each to the bitlines BLe0~BLo1 through DC contacts, while their sources S6~S9 are commonly connected to the high voltage node SOBLK2 through via contacts. Pairs of sources S6/S7, S8/S9 of the high voltage NMOS transistors NM6~NM9 are connected to the high voltage node SOBLK2 through a single via contact. The layout features shown in FIG. 7 are similar to that shown in FIG. 6, one exception being the existence of the fourth high voltage switching circuit 350 between the virtual power node VIRPWR and the high voltage node SOBLK2 that is commonly connected to the sources of the high voltage transistors NM6~NM9.

During an erase operation, the drains of the high voltage transistor NM6~NM9 are charged up to the erase voltage VER and the sources of the high voltage transistors NM6~NM9, i.e., the high voltage node SOBLK2, are charged up to VER−Vth. Although the interval between the DC contact and the bitline is regarded as narrow, there are few electric fields between the bitlines and the DC contacts because the voltage levels adjacent to each other are nearly similar (i.e., VER vs. VER−Vth). Thus, the leakage of the high voltage supplied to the bitlines for erasing data stored in the memory cells may be prevented. Even if leakage occurs, it is negligible and does not affect retention of an effective bitline voltage.

Since the isolation signal PBDI is operable in the range of the low voltage (Vcc or lower than) as aforementioned with regarding to the second high voltage circuit 250, the high voltage of the node SOBLK2 cannot be forwarded into the bitline driver 500, preventing a leakage of the bitline voltage during an erase operation.

In the embodiments described above, the bitline driver 500 is disposed opposite to the page buffer 400, with the memory cell array 100 interposed between them. In alternative embodiments the bitline driver 500 may be located between the memory cell array 100 and the first high voltage switching circuit 200.

As described above, the invention is advantageous to preventing the bitline voltage leakage during an erase operation, which improves the efficiency and reliability of an erase operation in a high density NAND flash memory device. In a high density NAND flash memory device, although bitline pitches are narrow, the very small electric fields between adjacent bitlines contribute to reducing undesirable voltage leakage between them.

Moreover, even in the condition that the high-voltage and low-voltage circuit fields are conductively used in a single bulk or a substrate, the low-voltage operable circuits such as the bitline driver and the page buffer can be protected from the high voltage action. As a result, electrical breakdowns or physical damages in the low-voltage circuits due to the high voltage leakage are prevented therefrom and thereby it enhances the stability of the erase operation.

The invention may be practiced in many ways. What follows are exemplary, non-limiting descriptions of some embodiments of the invention.

According to some embodiments, a nonvolatile semiconductor memory device includes a number of bitlines arranged adjacent to each other, a first circuit operable in a first voltage range, a second circuit for electrically isolating the first circuit from the bitlines when a second voltage higher than the first voltage range is applied to the bitlines, and a third circuit for electrically isolating the first circuit from the second circuit when the second voltage is applied to the bitlines to prevent a leakage current from flowing from the bitlines to the first circuit.

The first circuit may be a page buffer or a bitline driver. The third circuit is connected between the second circuit and the page buffer or the bitline driver. The third circuit is operable in response to a voltage in the first voltage range. The first voltage may be a power supply voltage or a voltage less than the power supply voltage.

The second circuit includes a number of transistors connected to the bitlines and having gates operable with the second voltage, the gate being coupled to the second voltage during a data erase operation. The third circuit includes a number of transistors connected to the bitlines and having gates held in the first voltage range during the data erase operation.

The transistors of the second and third circuits are arranged to overlap on different rows in order to reduce a layout size.

According to other embodiments, a nonvolatile semiconductor memory device having a high voltage field and a low voltage field includes a circuit for electrically isolating the low voltage field from the high voltage field in response to a voltage of a first voltage region when a second voltage higher than the first voltage range is applied to the high voltage field.

The high voltage field includes a number of bitlines arranged adjacent to each other and coupled to a number of erasable memory cells.

According to still other embodiments, a nonvolatile semiconductor memory device that is operable with a first voltage and a second voltage higher than the first voltage includes a number of bitlines arranged adjacent to each other, the bitlines operable with the second voltage during an erase operation, a bitline driver for controlling driving conditions of the bitlines, the bitline driver operable with the first voltage, a page buffer for loading data to be transferred to the bitlines and sensing data to be transferred from the bitlines, the page buffer operable with the first voltage, a first high voltage switching circuit connected between the bitlines and the page buffer, a second high voltage switching circuit connected between the first high voltage switching circuit and the page buffer, the second high voltage switching circuit operable in response to the first voltage, a third high voltage switching circuit connected between the bitlines and the bitline driver, and a fourth high voltage switching circuit connected between the third high voltage switching circuit and the bitline driver, the fourth high voltage switching circuit operable in response to the first voltage.

The bitline driver may be connected to a virtual power node. The third high voltage switching circuit includes a number of transistors whose sources are connected to a high voltage node. The fourth high voltage switching circuit may be interposed between the virtual power node and the high voltage node.

Although the invention has been described above with reference to numerous exemplary embodiments, it is not limited only to the particular embodiments described above. It will be apparent to those skilled in the art that various substitutions, modifications, and changes may be made to the described embodiments without departing from the scope and spirit of the invention as defined in the attached claims.

We claim:

1. A nonvolatile semiconductor memory device comprising:
   a plurality of bitlines arranged adjacent to each other;
   a first circuit structured to operate in a first voltage range;
   a second circuit structured to electrically isolate the first circuit from the bitlines when a second voltage greater than the first voltage range is applied to the bitlines; and
   a third circuit structured to electrically isolate the first circuit from the second circuit when the second voltage is applied to the bitlines to prevent a leakage current from flowing from the bitlines to the first circuit.

2. The device of claim 1, wherein the second voltage is applied to the bitlines during a data erase operation.

3. The device of claim 1, wherein the bitlines are coupled to erasable NAND flash memory cells structured to operate with the second voltage.

4. The device of claim 1, wherein the first circuit comprises a page buffer.

5. The device of claim 4, wherein the third circuit is connected between the second circuit and the page buffer.

6. The device of claim 5, wherein the third circuit is structured to operate in response to a voltage within the first voltage range.

7. The device of claim 1, wherein the first circuit comprises a bitline driver.

8. The device of claim 7, wherein the third circuit is connected between the second circuit and the bitline driver.

9. The device of claim 8, wherein the third circuit is structured to operate in response to a voltage within the first voltage range.

10. The device of claim 1, wherein the first voltage is no greater than a power supply voltage of the device.

11. The device of claim 1, wherein the second circuit comprises a plurality of transistors connected to the bitlines and having gates structured to operate with the second voltage, the gate structured to be coupled to the second voltage during a data erase operation.

12. The device of claim 11, wherein the third circuit comprises a plurality of transistors connected to the bitlines and having gates structured to be held within the first voltage range during the data erase operation.

13. The device of claim 12, wherein the transistors are structured to overlap on different rows from each other.

14. A nonvolatile semiconductor memory device comprising:
    a plurality of bitlines arranged adjacent to each other;
    a first circuit structured to operate in a first voltage range;
    a second circuit structured to operate in the first voltage range;
    a third circuit structured to electrically isolate the first circuit from the bitlines when a second voltage greater than the first voltage range is applied to the bitlines;
    a fourth circuit structured to electrically isolate the first circuit from the third circuit when the second voltage is applied to the bitlines;
    a fifth circuit structured to electrically isolate the second circuit from the bitlines when the second voltage is applied to the bitlines and to prevent a leakage current from flowing from the bitlines to the first circuit; and
    a sixth circuit structured to electrically isolate the second circuit from the fifth circuit when the second voltage is applied to the bitlines and to prevent a leakage current from flowing from the bitlines to the second circuit.

15. The device of claim 14, wherein the second voltage is applied to the bitlines during a data erase operation.

16. The device of claim 14, wherein the bitlines are coupled to erasable NAND flash memory cells structured to operate with the second voltage.

17. The device of claim 14, wherein the first circuit comprises a page buffer and the second circuit comprises a bitline driver.

18. The device of claim 17, wherein the fourth circuit is connected between the third circuit and the page buffer.

19. The device of claim 18, wherein the fourth circuit is structured to operate in response to a voltage within the first voltage range.

20. The device of claim 17, wherein the sixth circuit is connected between the fifth circuit and the bitline driver.

21. The device of claim 20, wherein the sixth circuit is structured to operate in response to a voltage within the first voltage range.

22. The device of claim 14, wherein an upper voltage limit of the first voltage range is no greater than a power supply voltage of the device.

23. The device of claim 14, wherein the third circuit comprises a plurality of transistors connected to the bitlines and having gates structured to operate with the second voltage, the gates structured to couple to the second voltage during a data erase operation.

24. The device of claim 23, wherein the fourth circuit comprises a plurality of transistors connected to the bitlines and having gates structured to be held in the first voltage range during the data erase operation.

25. The device of claim 24, wherein the transistors are structured to overlap on different rows.

26. A nonvolatile semiconductor memory device having a high voltage field and a low voltage field, the device comprising:

a circuit configured to electrically isolate the low voltage field from the high voltage field in response to a voltage in a first voltage range when a second voltage greater than the first voltage range is applied to the high voltage field.

27. The device of claim 26, wherein the high voltage field includes a plurality of bitlines arranged adjacent to each other and coupled to a plurality of erasable memory cells.

28. The device of claim 26, wherein the second voltage is configured to be applied to the bitlines during an operation for erasing data stored in the memory cells.

29. The device of claim 26, wherein an upper limit of the first voltage range is no greater than a power supply voltage of the device.

30. A nonvolatile semiconductor memory device configured to operate with a first voltage and a second voltage higher than the first voltage, the device comprising:

a plurality of bitlines arranged adjacent to each other, the bitlines configured to operate with the second voltage during an erase operation;

a bitline driver configured to control driving conditions of the bitlines, and configured to operate with the first voltage;

a page buffer configured to operate with the first voltage, the page buffer configured to load data for transfer to the bitlines and configured to sense data to be transferred from the bitlines;

a first high voltage switching circuit connected between the bitlines and the page buffer;

a second high voltage switching circuit connected between the first high voltage switching circuit and the page buffer, the second high voltage switching circuit configured to operate in response to the first voltage;

a third high voltage switching circuit connected between the bitlines and the bitline driver; and a fourth high voltage switching circuit connected between the third high voltage switching circuit and the bitline driver, the fourth high voltage switching circuit configured to operate in response to the first voltage.

31. The device of claim 30, wherein an upper voltage limit of the first voltage is no greater than a power supply voltage of the device.

32. The device of claim 30, wherein the bitline driver is connected to a virtual power node.

33. The device of claim 32, wherein the third high voltage switching circuit comprises a plurality of transistors whose sources are connected to a high voltage node.

34. The device of claim 33, wherein the fourth high voltage switching circuit is interposed between the virtual power node and the high voltage node.

* * * * *